United States Patent
Sattler et al.

(10) Patent No.: US 6,741,660 B1
(45) Date of Patent: May 25, 2004

(54) METHOD FOR MODULATION OF A BASIC CLOCK FOR DIGITAL CIRCUITS, AND A MODULATOR FOR CARRYING OUT THE METHOD

(75) Inventors: Frank Sattler, Babenhausen (DE); Walter Klumb, Mommenheim (DE)

(73) Assignees: Mannesmann VDO AG, Frankfurt (DE); Fujitsu Microelectronics Europe GmbH, Dreieich-Buchschlag (DE)

( * ) Notice: Subject to any disclaimer, the term of this patent is extended or adjusted under 35 U.S.C. 154(b) by 445 days.

(21) Appl. No.: 09/615,912

(22) Filed: Jul. 13, 2000

(30) Foreign Application Priority Data

Jul. 19, 1999 (DE) .......................... 199 33 117

(51) Int. Cl.[7] ............................ H04L 27/04
(52) U.S. Cl. ..................................... 375/295
(58) Field of Search ................. 375/295, 346, 375/354; 327/291, 292, 294, 261, 276, 277

(56) References Cited

U.S. PATENT DOCUMENTS 6,393,078 B1 * 5/2002 Sattler ..................... 375/346

FOREIGN PATENT DOCUMENTS

| DE | 4423186  | 1/1995  |
|----|----------|---------|
| DE | 4442403  | 9/1996  |
| DE | 19517265 | 11/1996 |
| WO | 9858449  | 12/1998 |

* cited by examiner

Primary Examiner—Don N. Vo
(74) Attorney, Agent, or Firm—Martin A. Farber

(57) ABSTRACT

In a method for modulation of a basic clock for digital circuits, in which the intervals between adjacent switching edges are varied, with the basic clock being split into equidistant sections, and the intervals between adjacent switching edges being varied as a function of cyclically recurring random numbers, the position of a switching edge ($a_{i+1}$) following a switching edge ($a_i$) to be calculated as follows:

$$a_{i+1} = \left(a_i + p - \left(\frac{N-1}{2} - Z_{i+1}\right)\right) \bmod p$$

where
p is the number of equidistant sections per half-cycle
N is the number of possible switching edges, with N being an odd number, and Z is the random number. A corresponding modulator uses the method described above in an equivalent manner.

14 Claims, 6 Drawing Sheets

METHOD FOR MODULATION OF A BASIC CLOCK FOR DIGITAL CIRCUITS, AND A MODULATOR FOR CARRYING OUT THE METHOD

FIELD AND BACKGROUND OF THE INVENTION

The invention relates to a method for modulation of, a basic clock for digital circuits, and to a modulator for modulation of a basic clock for digital circuits. The basic clock is modulated in order to give a broader bandwith to interference which is caused by the basic clock, and hence to distribute the interference energy over additional frequencies and thus to reduce the absolute magnitudes of, the interference spikes that occur.

Patent Application (DE 198 02 065.1) which has already been submitted by the applicant, discloses a method for modulation of a basic clock for digital circuits, and a corresponding modulator, in which the basic clock is split into equidistant time intervals, and the number of intervals is varied as a function of cyclically recurring random numbers, and the intervals between adjacent switching edges are varied in this manner.

This method results either in phase modulation or frequency modulation. A disadvantage of phase modulation is that the basic clock is still at a high level with such a method and a corresponding modulator.

A disadvantage of a method with frequency modulation and corresponding modulator is that, although frequency modulation is achieved which heavily attenuates the fundamental frequency, its average over time does not, however, directly correspond to the fundamental frequency. Applications which require a stable time platform corresponding to the fundamental frequency thus cannot be operated with the modulated clock.

SUMMARY OF THE INVENTION

The object of the invention is thus to specify a method for frequency modulation of a basic clock, which emits a modulated clock which, on average, is identical to the basic clock, and to specify a corresponding modulator for carrying out the method.

For a method, the object is achieved in that, in the method, the position of a switching area $a_{i+1}$ following a switching edge $a_1$ is calculated as follows:

$$a_{i+1} = \left(a_1 + p - \left(\frac{N-1}{2} - Z_{i+1}\right)\right) \bmod p$$

where p is the number of equidistant sections per half-cycle

N is the number of possible switching edges, with N being an odd number, and

Z is the random number.

Appropriate selection of the random numbers in -this case allows a modulated frequency f mod to be produced, whose average over a period of time corresponds to the fundamental frequency. This, for example, makes it possible to use the modulated frequency to provide an accurate timebase for, for example, a clock.

The selection of the random numbers is particularly simple if said random numbers are inverted for n cycles, after n cycles, and the inverted numbers are then used to derive the switching edges. This means that, even if the selection of the random numbers used is unfortunate, the modulated frequency on average corresponds to the fundamental frequency.

The equidistant intervals can easily be produced by passing the basic clock via delay units.

For example, it is also possible to produce the equidistant intervals by the output of a counter which is operated at a multiple of the fundamental frequency to be modulated.

Since the delay units have delay elements which are connected or disconnected individually and/or in groups, it is possible to vary the equidistant time intervals.

Changes to the operating parameters can be compensated for by calibration of the delay units.

A modulator according to the invention has an arithmetic unit which can calculate the formula from claim 1.

One particularly simple implementation of the modulator is obtained by passing the basic clock to be modulated via a number of delay units, with the various delays being provided by appropriate tapping points between the delay units.

Since the delay times of the delay units are variable, the modulator overall can be used for different fundamental frequencies and modulation levels.

An inversion apparatus for inversion of the random numbers makes it simple to select said random numbers. This inversion apparatus can be switched on after n cycles of the random numbers, and can be switched off again after a further n cycles. As long as the random numbers are inverted, the inverted random numbers are used to derive the intervals between adjacent switching edges, rather than the random numbers themselves. This means that the average clock duration of the modulated frequency is equal to the duration of the modulated basic clock, irrespective of the selection of the random numbers.

BRIEF DESCRIPTION OF THE DRAWINGS

The invention will be explained in more detail in the following text with reference to exemplary embodiments shown in the drawings.

In the figures of the drawings.

DETAILED DESCRIPTION OF THE PREFERRED EMBODIMENT

Figure 1:
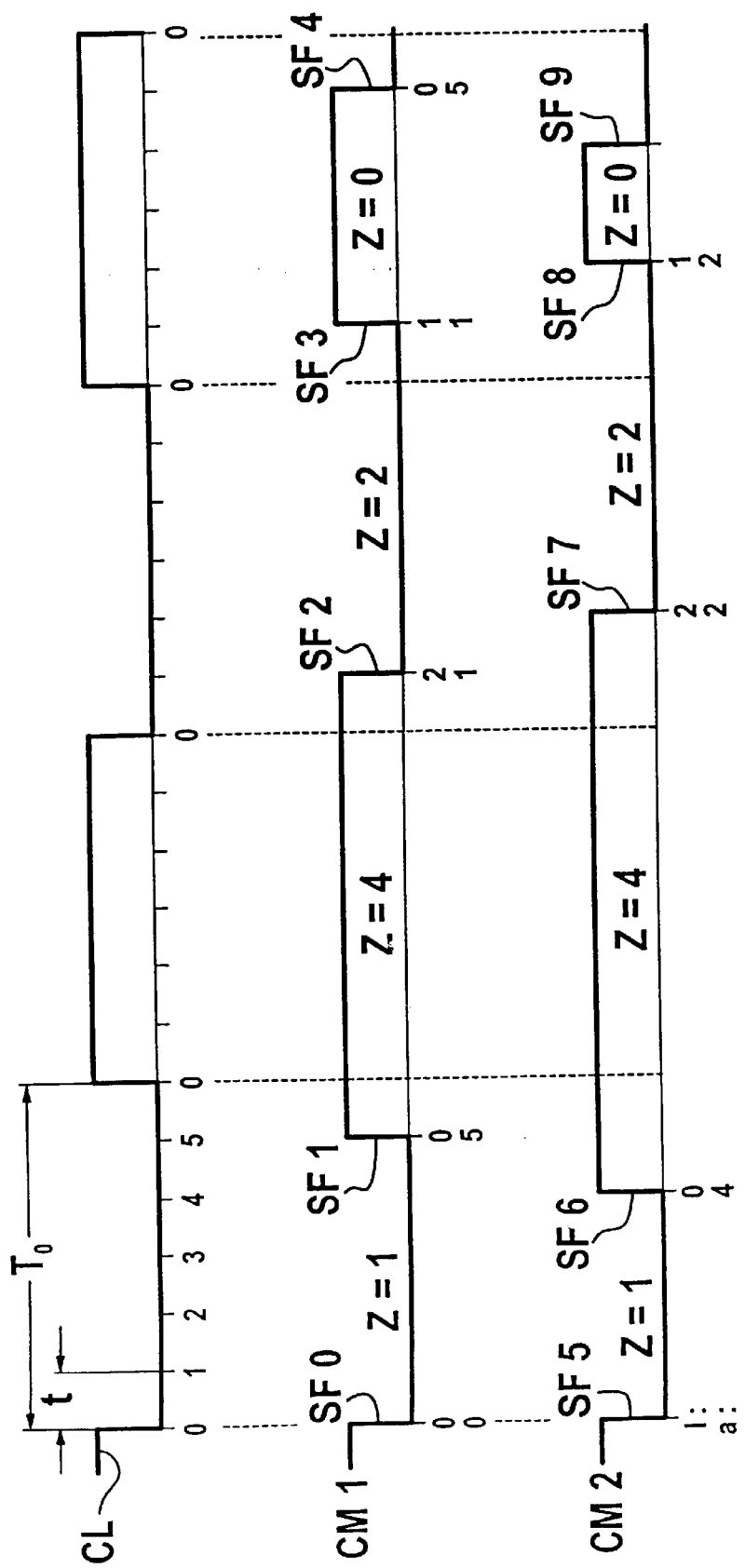
FIG. 1 shows a diagram including the basic clock and the generation of the modulated clock.

FIG. 1 shows an unmodulated basic clock CL whose half-cycles $T_0$ are each split into 6 sections of length t=1. A random number generator supplies 5 different numbers Z 0 to 4 in periodic cycles 5. The intervals between the individual switching edges of the clock to be modulated are governed by the random number Z and the modulation level K. Thus, the interval between the adjacent switching edges for the central random number (2) is one half-cycle $T_0$. For a modulation level of 1, the switching edge intervals for the other random numbers are as follows:

0=4t
1=5t
3=7t
4=8t

The random numbers for a modulation level of 2 are:

0=2t
1=4t
3=8t
4=10t

One option for calculating the respective next switching edge SF is provided by the following Equation 1:

$$a_{i+1} = \left(a_1 + p - \left(\frac{N-1}{2} - Z_{i+1}\right)K\right) \bmod p = X \bmod p \quad (1)$$

and, furthermore:

$x=I*p+ax*t$ where I is the interval in which the next switching edge occurs, p is the number of possible switching points per half-cycle $T_0$, and a is the position of the switching edge in the corresponding interval.

The calculation of the switching edge of the modulated clock CM 1 with the modulation level 1 gives the following expression for the random 1 at the start of the last switching edge SF 0 with the position a=0 in the interval 0:

$$a_{i+1} = \left(0 + 6 - \left(\frac{5-1}{2} - 1\right) \times 1\right) \bmod 6 = 5 \bmod 6$$

$5=I*6+5*1$ from which $I=0 \; a=5$

This means that the switching edge SF 1 in the same interval occurs at a=5. If I=1, the next switching edge occurs in the next interval, and if I=2, the switching edge occurs in the next-but-one interval.

For the switching edge SF 2:

$$a_{i+1} = \left(5 + 6 - \left(\frac{5-1}{2} - 4\right)*1\right) \bmod 6 = 13 \bmod 6$$

$13=I*6+a*1$ $I=2 \; a=1$

This means that the switching edge SF 2 occurs in the next-but-one interval for the value a=1.

For the switching edge SF 3:

$$a_{i+1} = \left(1 + 6 - \left(\frac{5-1}{2} - 2\right)*1\right) \bmod 6 = 7 \bmod 6$$

$7=I*6+a*1$ $I=1 \; a=1$

Correspondingly, for the switching edge SF 4:

$$a_{e+1} = \left(1 + 6 - \left(\frac{5-1}{2} - 0\right)*1\right) \bmod 6 = 5 \bmod 6$$

$5=I*6+a*1$ $I=0 \; a=5$

This means that the switching edge SF 4 occurs in the same interval at the point 5.

The following expressions result for the switching edges SF 6 to SF 9 for the clock CM 2 with the modulation level 2:

For the switching edge SF 6:

$$a_{i+1} = \left(0 + 6 - \left(\frac{5-1}{2} - 1\right)*2\right) \bmod 6 = 4 \bmod 6$$

$4=I*6+a*1$ $I=0 \; a=4$

For the switching edge SF 7:

$$a_{i+1} = \left(4 + 6 - \left(\frac{5-1}{2} - 4\right)*2\right) \bmod 6 = 14 \bmod 6$$

$14=I*6+a*1$ $I=2 \; a=2$

For the switching edge SF 8:

$$a_{i+1} = \left(2 + 6 - \left(\frac{5-1}{2} - 2\right)*2\right) \bmod 6 = 8 \bmod 6$$

$6=I*6+a*1$ $I=1 \; a=2$

For the switching edge SF 9:

$$a_{i+1} = \left(2 + 6 - \left(\frac{5-1}{2} - 0\right) \times 2\right) \bmod 6 = 4 \bmod 6$$

$4=I*6+a*1$ $I=0 \; a=4$

Figure 2:
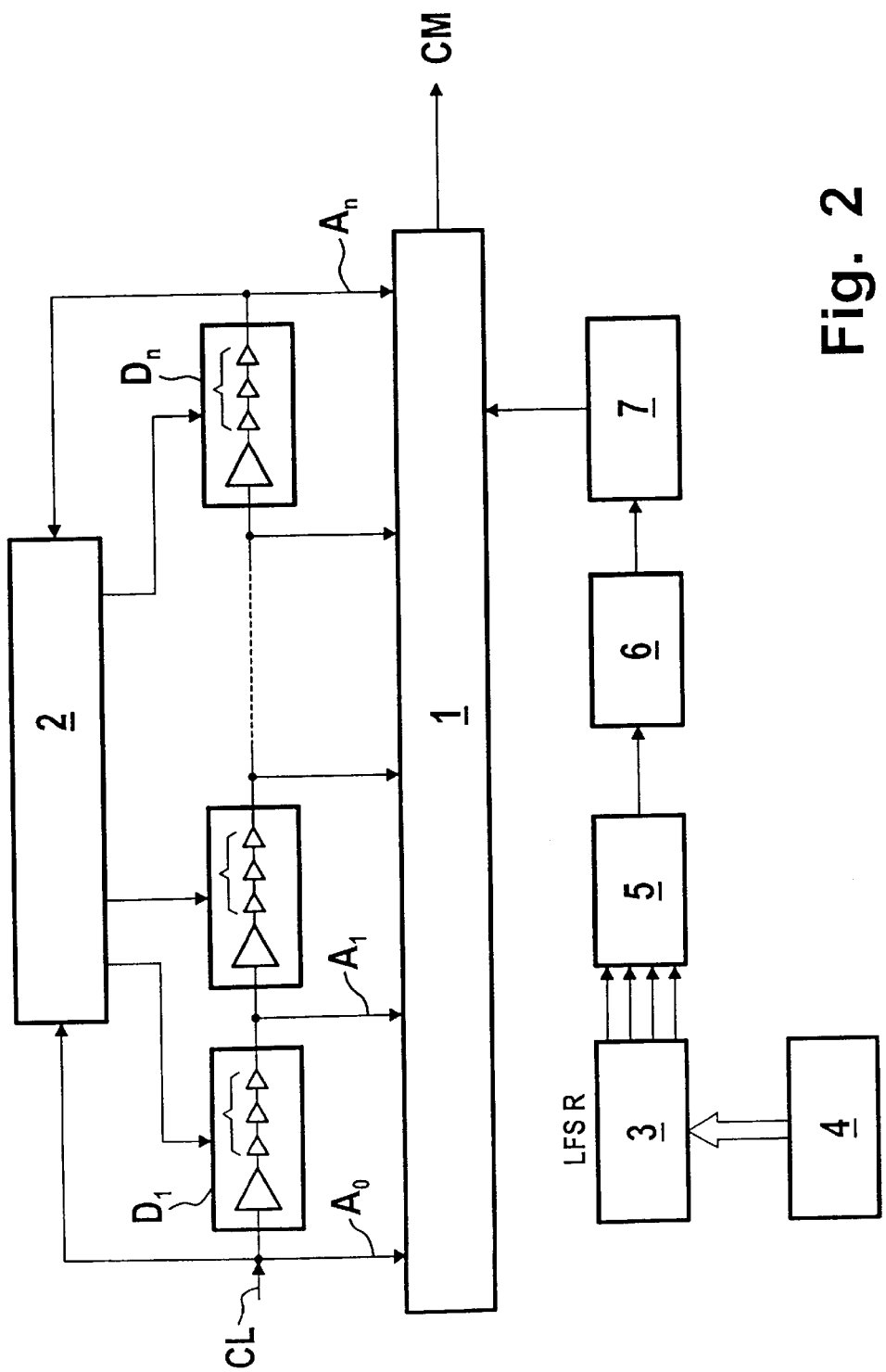
FIG. 2 shows a block diagram of one possible exemplary embodiment.

The block diagram of an exemplary embodiment of the modulator according to the invention in FIG. 2 has n series-connected delay units $D_1$ to $D_n$ with tapping points $A_0$ to $A_n$ upstream and downstream of them, which are connected to a multiplexer 1. The individual delay units $D_1$ to $D_n$ each produce a delay of duration $t=2T_0/n$, so that the overall series of delays to the unmodulated basic clock CL applied to the input 6 amounts to a total delay of one cycle. A calibration apparatus 2 compares the basic clock CL applied to the input E with the signal which is present at the output $A_n$ of the last delay element $D_n$. If the times of the switching edges of the two signals do not match, the calibration apparatus 2 calibrates the delay units $D_1$ to $D_n$ so that the two signals do match.

m random numbers are produced cyclically by a shift register 3 with feedback.

As soon as one cycle of the random numbers has been completed, the random numbers read from the shift register with feedback are inverted by an inverter 5 in the next cycle, in order to obtain a uniform random number distribution, and thus the different delays. If there is an even number of different random numbers, this even number is reduced by one in a mapping apparatus 6, to produce an odd number of different random numbers. This reduction can be achieved, for example, by ignoring the highest random number when it is present, and considering the other random numbers successively. This can be achieved, for example, by a counter, which counts from zero up to the highest random number that is still permissible, being read when this highest random number is present, and then being incremented by one.

As already described with respect to FIG. 1, the random numbers obtained in this way are used in the arithmetic unit 7 in order to determine that tapping point $A_0$ to $A_n$ to which the multiplexer 1 must be connected to achieve the switching edge corresponding to the random number and to the modulation level.

Figure 3:
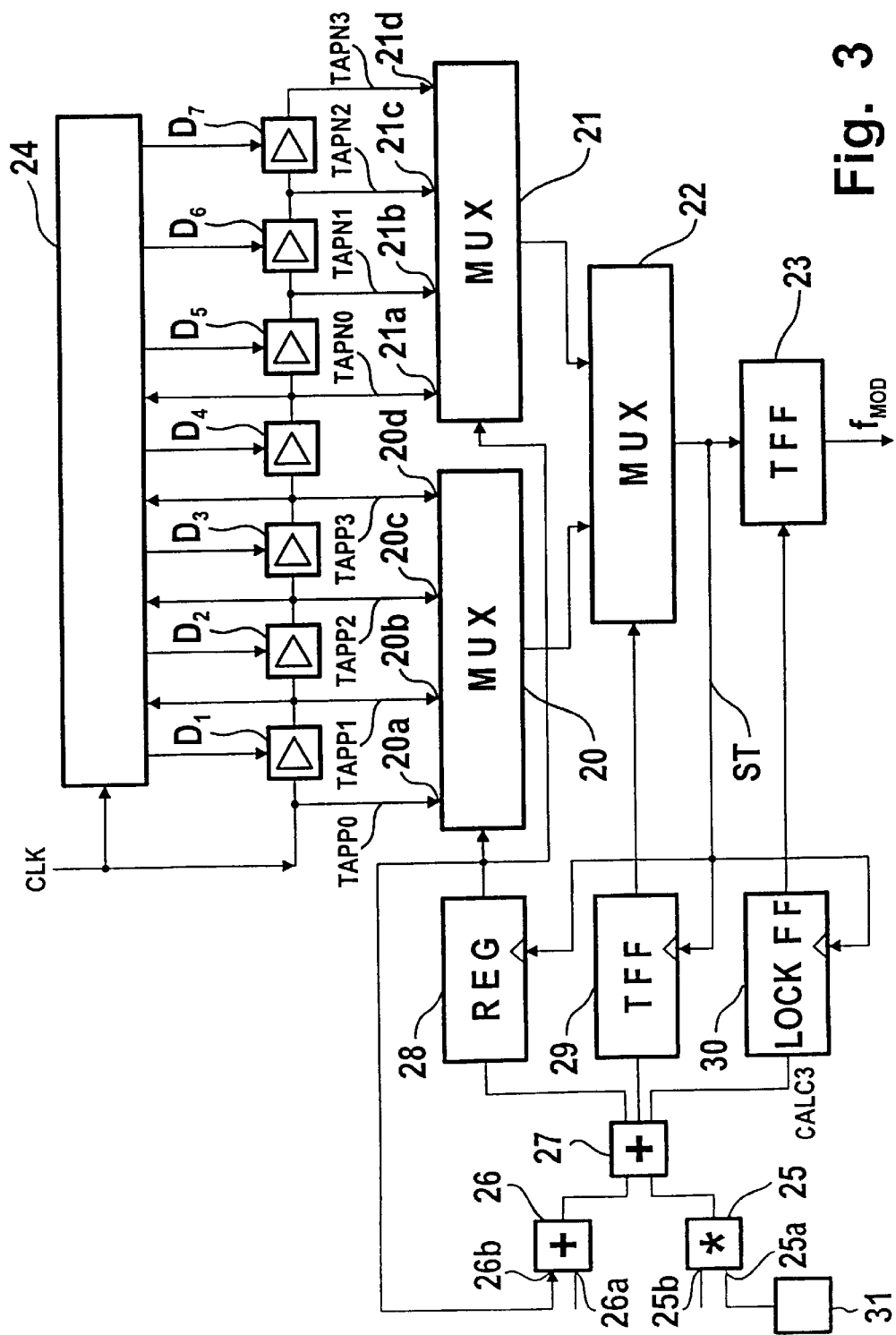
FIG. 3 shows an exemplary embodiment of a particularly preferred modulator.

In FIG. 3, 7 delay units $D_1$–$D_7$ are connected in series with a delay chain via which the basic clock CLK is passed. The basic clock CLK (corresponding to the signal TAPP0) and the signals TAPP1–P3 which leave the delay units $D_1$–$D_3$ are applied to respective inputs 20$a$–$d$ of a multiplexer 20, and the signals TAP N0–N3 which leave the delay units $D_4$–$D_7$ are respectively applied to an input 21$a$–$d$ of the multiplexer 21. The outputs of the multiplexers 20, 21 are connected to the inputs of a multiplexer 22, whose output is applied to the input of a toggle flipflop 23, whose output produces the modulated clock $f_{MOD}$.

In addition, the signals TAPP0–TAPP3 are also passed to a calibration unit 24 which monitors whether the delay to these signals is correct. If this is not the case, the delay units $D_1$–$D_4$ are calibrated until the delay matches. The values determined for the delay units $D_1$–$D_4$ are also used for the delay units $D_5$ to $D_7$, since they have the same operating parameters as the delay units $D_1$–$D_4$, particularly if all the delay units $D_1$–$D_7$, or even the entire modulator, is integrated in an IC. This calibration process may be carried out continuously or at specific time intervals or, for example, may be carried out when certain parameters change, for example the temperature or circuit.

FIG. 3 also shows a multiplier 25, two adders 26, 27, a register 28, a toggle flipflop 29, a lock flipflop 30 and a random number generator 31.

Equation 1 can be written as follows:

$$S=a_{i+1}=(a_i+K^*Z_{i+1}+c) \bmod p$$

where $c=p-((N-1):2)^*K$

The next random number $Z_{i+1}$ is applied to the input 25$a$, the modulation level K is applied to the input 25$b$, the constant c is applied to the input 26$a$, and the position $a_i$ of the previous switching edge SF, which is read from the register 28, is applied to the input 26$b$. The product from the multiplier 25 and the sum from the adder 26 are added together in the adder 27 to form a sum S. The most-significant bit in this sum S is passed to the set input of the lock flipflop 30, the second most-significant bit is passed to the input of the toggle flipflop 29, and the two other, least-significant bits are passed to the register 28. The output of the register 28 drives the two multiplexers 25, 26, and is also fed back to one input of the adder 26.

Figure 4:
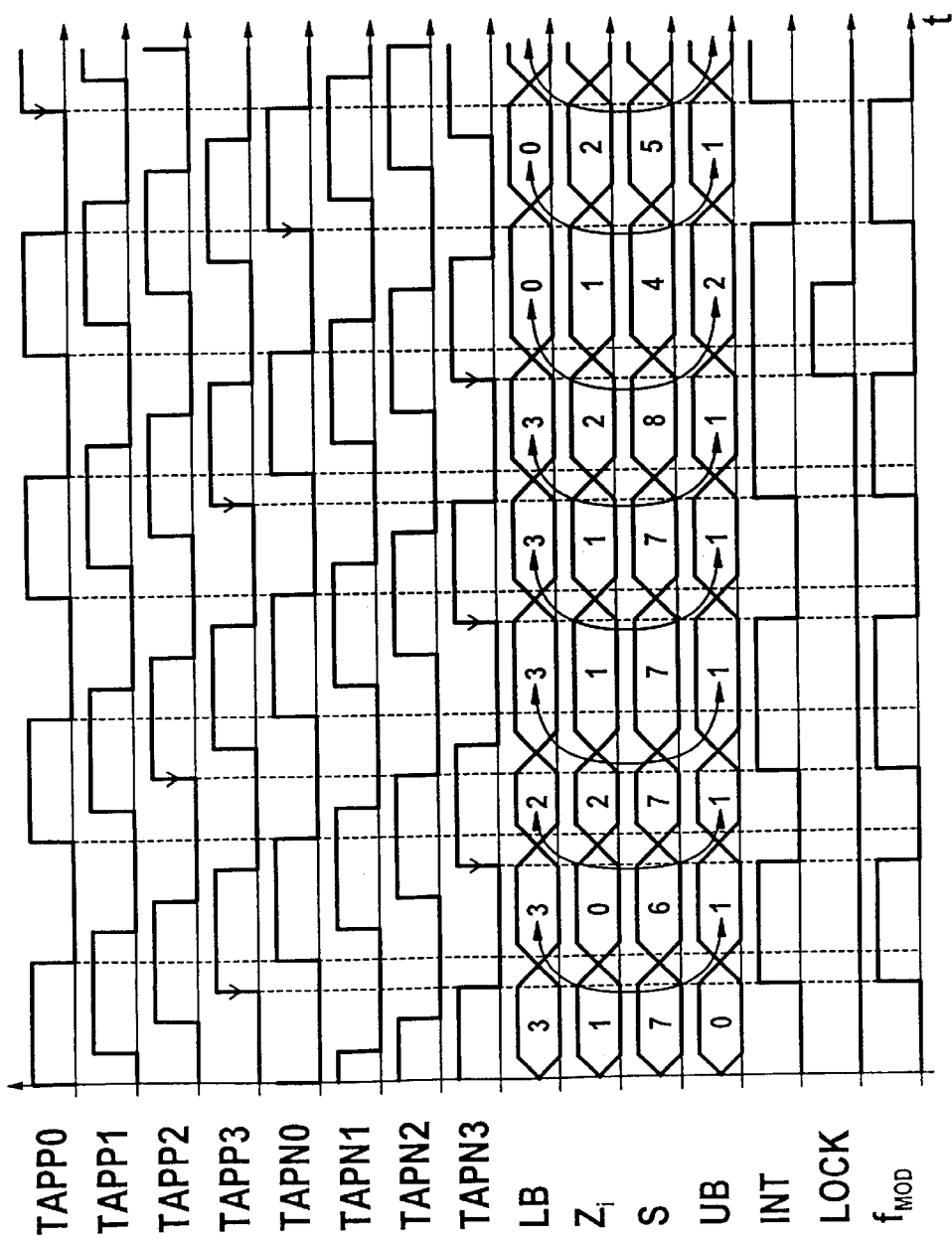
FIG. 4 shows a functional diagram of the exemplary embodiment shown in FIG. 3.

FIG. 4 shows an example of the way in which the modulator described above operates, in the form of a diagram. In this case, TAPP0 to TAPP3 denote those signals which are applied to the inputs of the multiplexer 20, and TAPN0 to N3 denote those signals which are applied to the inputs of the multiplexer 21. LB denotes the number resulting from the two least-significant bits in the sum S, and thus represents the number of the signal TAPP0–TAPP3 or TAPN0–TAPN3, $Z_i$ represents the respective random number that is present, UB represents the number of the two most-significant bits in the sum S, INT represents the output of the toggle flipflop 29, and LOCK represents the output of the lock flipflop 30.

The number of possible random numbers Z is assumed to be 3, namely 0, 1 and 2, the number of possible switching points p per half-cycle $T_0$ is 4 (specifically, the respective rising edges of TAPP0 to P3 and TAPN0 to N3), and the modulation level is assumed to be K=1.

The sum S may therefore assume values from 3 to 8, written in digital form as follows:

|   | UB | LB |
|---|----|----|
| 3 | 00 | 11 |
| 4 | 01 | 00 |
| 5 | 01 | 01 |
| 6 | 01 | 10 |
| 7 | 01 | 11 |
| 8 | 10 | 00 |

The modulation starts with the value 3 in the register 28, the random number $Z_i$=1, and the outputs of the flipflops 29, 30 are assumed to be 0. If the value 0 is applied to the input of the multiplexer 22, it passes this value to the multiplexer 20, and if the value is 1, it passes this value to the multiplexer 21. The number 3 means that the input TAPP3 or TAPPN3 of the multiplexer 21 is passed through, so that the signal which is present downstream of the delay unit D3 is passed on, and switches over the output of the toggle flipflop 23 when its next positive edge occurs.

The next input to be passed through, which is calculated in parallel with this, is:

$$S=3+1\times1+3=7 \text{ or binary } 0111$$

is transferred to the register 28, the toggle flipflop 29 and the lock flipflop 30 when the next positive edge of the signal ST leaves the multiplexer 22. The two least-significant bits are thus UB=11=3, and the most-significant bits are 01=1. The register 28 thus contains the number 3, so that the inputs TAPP3 and TAPN3 are passed through, the second most-significant bit is a 1, so that the output of the toggle flipflop 29 switches over, to be precise from 0 to 1, so that the signal at the output of multiplexer 21 is passed on. The positive edge of TAPN3 thus once again switches the toggle flipflop 23 to 0. The rest of the calculation process is carried out in a corresponding manner. If the sum is S=8, digitally 1000, the lock flipflop 30 locks the toggle flipflop 23, so that its output cannot change.

Figure 5:
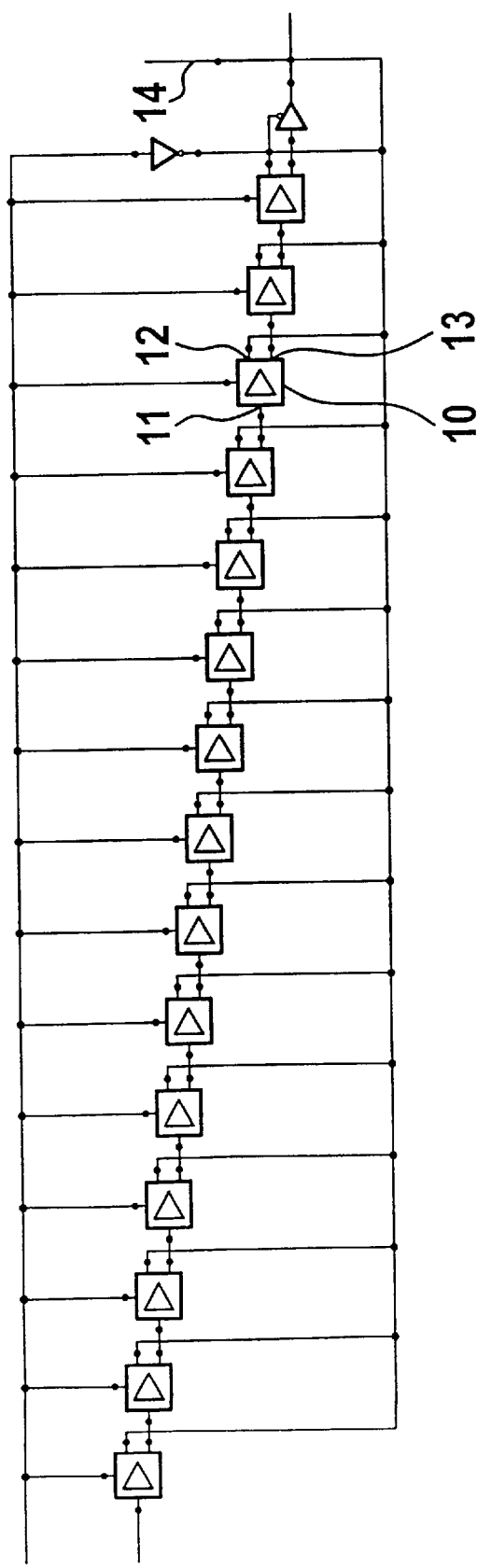
FIG. 5 shows a block diagram of an exemplary embodiment of a delay unit.

FIG. 5 shows one possible design of a delay unit D. The delay unit D comprises m series-connected delay elements 10. The delay elements 10 each have a clock input 11, two clock outputs 12, 13 and a control input 14. The respective clock output 12 is connected to the output 14 of the delay unit D, while the respective clock output 13 is connected to the clock input 11 of the respective following delay element 10. The control inputs 14 are used to determine the clock output 12, 13 at which the (delayed) clock signal is present, and thus to determine whether the clock signal should be delayed further or should be passed to the output 14 without being delayed. The delay time of each delay unit D can thus be varied over a wide range.

Figure 6:
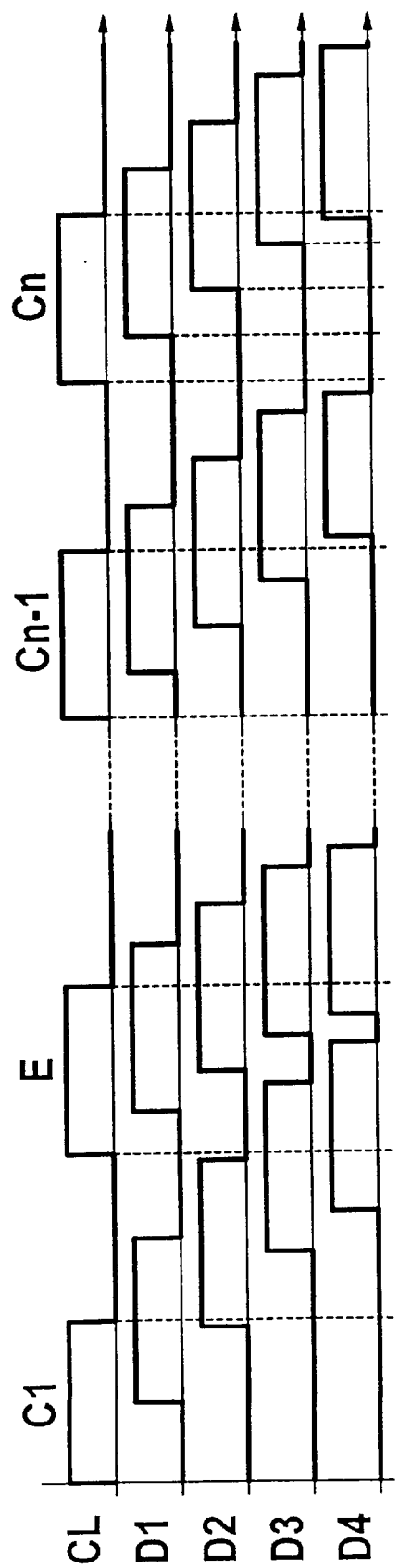
FIG. 6 shows one possibility for approximate calibration of series-connected delay units.

The flowchart in FIG. 6 shows one option for approximate calibration of the delay units shown in FIG. 3. Initially, in the first cycle C1, each delay unit D1–D4 uses the same number of delay elements in order to delay the clock CL. Since the clock is delayed by more than one complete half-cycle in the delay unit D4, the same number of delay elements are disconnected in each of the delay units D1–D4. This is carried out in a number of steps with a decreasing number, until the connection or disconnection of one delay element in each delay unit results in the clock being delayed by virtually; one half-cycle in the delay unit D4, thus reaching the end E of the coarse calibration process. Then, during the fine calibration process, individual delay elements in some delay units or one delay unit are then connected or disconnected until, in the last-but-one step Cn-1, the clock is delayed by more than one half-cycle in the delay unit D4 so that, in the final step Cn the disconnection of one delay element results in the series of delay units being calibrated such that, in the delay unit D4, the period by which it is shorter than one half-cycle of a clock is less than the time period of the delay of one delay element.

The delay units D5–D7 are then set appropriately.

It is also possible for all the delay units D1–D7 to be adjusted at the same time by arranging a further delay unit, which is not shown, after the delay unit D7, and if the delay units are adjusted in the manner described above by connecting or disconnecting delay elements until the clock at the output of the delay unit which is not shown is delayed by the duration of one full cycle.

We claim:

1. A method for modulation of a basic clock for digital circuits, in which intervals between adjacent switching edges are varied, with the basic clock being split into equidistant sections, and the intervals between adjacent edges being varied as a function of cyclically recurring random numbers, further comprising the step of calculating the position of a switching edge ($a_{i+1}$) following a switching edge ($a_1$) as follows:

$$a_{i+1} = \left(a_1 + p - \left\{\frac{N-1}{2} - Z_{i+1}\right\}\right) \bmod p$$

where p is the number of equidistant sections per half-cycle,

N is the number of possible switching edges, with N being an odd number, and

Z is the random number; and wherein the basic clock is passed via a changing number of delay units, and the intervals between adjacent switching edges are varied in this way.

2. The method as claimed in claim 1, further comprising the step of also introduction a modulation level K so that:

$$a_{i+1} = \left(a_1 + p - \left\{\frac{N-1}{2} - Z_{i+1}\right\}\right) \bmod p.$$

3. The method as claimed in claim 1, further comprising the steps of inverting the random numbers for n cycles, after n cycles, and using these inverted random numbers to derive the adjacent switching edges.

4. The method as claimed in claim 1, wherein said delay units each have a number of delay elements which are connected or disconnected individually and/or in groups.

5. The method as claimed in claim 1, further comprising the step of calibrating delay times of the delay units (D1–Dn).

6. The method as claimed in claim 5, further comprising the step of connecting or disconnecting delay elements (10) of the delay units in an approximated manner in steps in order to calibrate the delay units (D1–Dn).

7. The method as claimed in claim 6, wherein, first, a same number of delay elements (10) are in each case connected or disconnected during a coarse adjustment process in all the delay units (D1–Dn) and then, in a fine adjustment process, one delay element (10) is in each case connected or disconnected in one or more delay units (D1–Dn).

8. The method as claimed in claim 6, wherein, in a series of delay units (D1–D4), which extend from the first delay unit (D1) to the last delay unit (D4), at an output of which the clock is delayed by half a cycle when a delay is correct, a same number of delay elements (10) are in each case connected or disconnected during a coarse adjustment process in all the delay units (D1–D4), and then, in a fine adjustment process, one delay element (10) is in each case connected or disconnected in one or more delay units (D1–D4) until the clock sequence is delayed by half a cycle at the output of the last delay unit (D4), and wherein remaining delay units (D5–D7) are then set appropriately.

9. A modulator for modulation of a basic clock for digital circuits, in which intervals between adjacent switching edges can be varied, with the basic clock being split into equidistant sections, and the intervals between adjacent switching edges being varied as a function of cyclically recurring random numbers, wherein the position of a switching edge ($a_{i+1}$) following a switching edge ($a_1$) is calculatable in an arithmetic unit as follows:

$$a_{i+1} = \left(a_1 + p - \left\{\frac{N-1}{2} - Z_{i+1}\right\}\right) \bmod p$$

where p is the number of equidistant sections per half-cycle,

N is the number of possible switching edges, with N being an odd number, and

Z is the random number; and wherein said modulator has a number of series-connected delay units, with tapping points being arranged between the delay units, the basic clock can be passed via a changing number of the delay units, and the interval between the switching edges can be varied in this way.

10. The modulator as claimed in claim 9, wherein a modulation level (K) is selectable to produce the following formula:

$$a_{i+1} = \left(a_1 + p - \left\{\frac{N-1}{2} - Z_{i+1}\right\}\right) \bmod p.$$

11. The modulator as claimed in claim 9, wherein the random numbers are invertable for n cycles, after n cycles, and these inverted random numbers are usable to derive the adjacent switching edges.

12. The modulator as claimed in claim 9, wherein delay times of the delay units are variable and calibratable.

13. The modulator as claimed in claim 12, wherein the delay units have series-connected delay elements, which are connectable and disconnectable individually.

14. A modulator for modulation of a basic clock for digital circuits, in which intervals between adjacent switching edges can be varied, with the basic clock being split into equidistant sections, and the intervals between adjacent switching edges being varied as a function of cyclically recurring random numbers, wherein the position of a switching edge ($a_{i+1}$) following a switching edge ($a_1$) is calculatable in an arithmetic unit as follows:

$$a_{i+1} = \left(a_1 + p - \left\{\frac{N-1}{2} - Z_{i+1}\right\}\right) \bmod p$$

where p is the number of equidistant sections per half-cycle,

N is the number of possible switching edges, with N being an odd number, and

Z is the random number; and wherein the modulator further comprises an inversion apparatus for inversion of the random numbers, wherein the inversion apparatus is switchable on after n cycles and off again after a further n cycles, and wherein the intervals between adjacent switching edges are derivable from the inverted random numbers rather than from the random numbers themselves.

* * * * *